United States Patent
Nakayama et al.

(10) Patent No.: US 6,421,624 B1
(45) Date of Patent: Jul. 16, 2002

(54) MULTI-PORT DEVICE ANALYSIS APPARATUS AND METHOD AND CALIBRATION METHOD THEREOF

(75) Inventors: Yoshikazu Nakayama; Hirotaka Wagata, both of Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/496,073

(22) Filed: Feb. 1, 2000

(30) Foreign Application Priority Data

| Feb. 5, 1999 | (JP) | 11-029265 |
| Apr. 9, 1999 | (JP) | 11-102874 |
| May 21, 1999 | (JP) | 11-141092 |

(51) Int. Cl.$^7$ .............................. G01R 27/28
(52) U.S. Cl. .................. 702/117; 702/85; 702/107; 324/600; 324/601; 324/637; 324/638
(58) Field of Search ............... 702/117, 107, 702/85; 324/600, 601, 604, 605, 607, 608, 610, 637, 638, 629, 76.23, 646, 650, 76.43

(56) References Cited

U.S. PATENT DOCUMENTS 4,777,429 A  * 10/1988 Potter .................. 324/603
5,578,932 A  * 11/1996 Adamian ................ 324/601
6,147,501 A  * 11/2000 Chodora ................ 324/601
6,268,735 B1 * 7/2001 Craig et al. .............. 324/601

* cited by examiner

Primary Examiner—Marc S. Hoff
Assistant Examiner—Hien Vo
(74) Attorney, Agent, or Firm—Muramatsu & Associates

(57) ABSTRACT

A multi-port device analysis apparatus is capable of analyzing a multi-port device having three or more with improved efficiency and accuracy. The multi-port device analysis apparatus includes: a signal source for providing a test signal to one of terminals of a multi-port device under test (DUT); a plurality of test ports for connecting all of the terminals of the multi-port DUT to the corresponding test ports; a plurality of measurement units for measuring signals from the corresponding test ports; a reference signal measurement unit for measuring the test signal for obtaining reference data; a plurality of terminal resistors each being assigned to one of the test ports; and switch means for selectively providing the test signal to one of the test ports (input port) and disconnecting the terminal resistor from the input port while connecting the terminal resistors to all the other test ports; wherein parameters of the multiport DUT are acquired without changing the connections between the test ports and the terminals of the DUT, while changing selection of the test port until all of the test port being assigned as the input port.

21 Claims, 19 Drawing Sheets

Fig. 4

|  |  | S11  S21  S31 | S12  S22  S32 | S13  S23  S33 |
|---|---|---|---|---|
| SW1 | ① | ON → | OFF → | OFF → |
|  | ② | OFF → | ON → | ON → |
| SW2 | ① | ON → | ON → | ON → |
|  | ② | OFF → | OFF → | OFF → |
| SW3 | ① | ON → | ON → | ON → |
|  | ② | OFF → | OFF → | OFF → |
| SW4 | ① | OFF → | OFF ON → | OFF ON → |
|  | ② | ON → | ON OFF → | ON OFF → |
| SW5 | ① | ON  ON  OFF | ON  ON  OFF | ON  ON  OFF |
|  | ② | OFF OFF ON | OFF OFF ON | OFF OFF ON |
| Measurement |  | A  B  B | A  B  B | A  B  B |
| Sweep |  | 2 times | 2 times | 2 times |

Fig. 7

|  |  | S11  S21  S31 | S12  S22  S32 | S13  S23  S33 |
|---|---|---|---|---|
| SW1 | ① | ON → | OFF → | OFF → |
|  | ② | OFF → | ON → | ON → |
| SW2 | ① | ON → | ON → | OFF → |
|  | ② | OFF → | OFF → | ON → |
| Measurement | | A   B   C | A   B   C | A   B   C |
| Sweep | | 1 | 1 | 1 |

Fig. 9
| Mode | Test Port 44 | Test Port 46 | Test Port 48 |
|---|---|---|---|
| a | S | R | R |
| b | R | S | R |
| c | R | R | S |
Fig. 10(a)
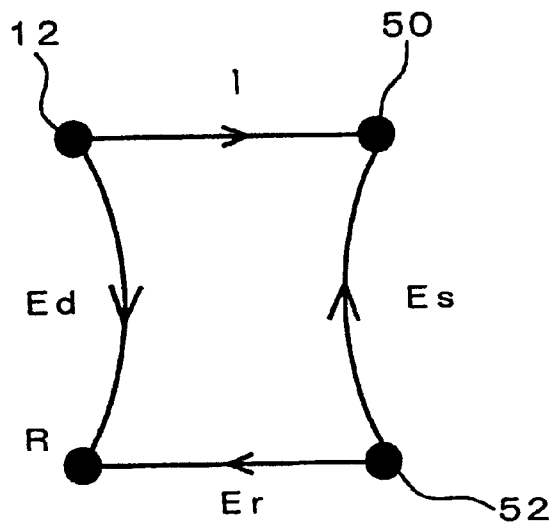
Fig. 10(b)
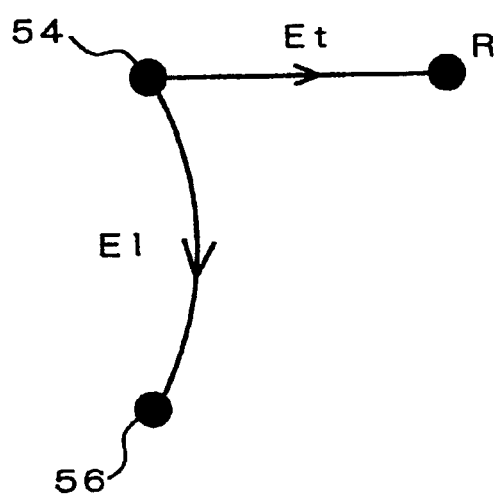

Fig. 16

| Mode | Test Port 44 | Test Port 46 | Test Port 48 |
|---|---|---|---|
| a | S | R | L |
| b | S | L | R |
| c | L | S | R |
| d | R | S | L |
| e | R | L | S |
| f | L | R | S |

MULTI-PORT DEVICE ANALYSIS APPARATUS AND METHOD AND CALIBRATION METHOD THEREOF

FIELD OF THE INVENTION

This invention relates to a multi-port device apparatus and method for analyzing the characteristics of the multi-port device having three or more terminals (ports), and more particularly, to a multi-port device analysis apparatus and method and a calibration method of the multi-port analysis apparatus for measuring various parameters of a multi-port device with high efficiency and high dynamic range without changing connections between the multi-port device under test and the analysis apparatus.

BACKGROUND OF THE INVENTION

In order to analyze the characteristics of the communication devices or communication components (device under test) used in various communication systems, a network analyzer is frequently used. A network analyzer obtains various test parameters, such as a transfer function, reflection characteristics, and phase characteristics (hereafter "scattering parameter S" or "S-parameter"), of a device under test. Such S-parameters are known in the art and determined by observing the frequency response (voltage and phase) of the device under test resulted in response to a sweep frequency signal from the network analyzer.

A network analyzer is usually comprised of two ports, one is input port and the other one is output port. The input port sends a sweep frequency signal (test signal) to the device under test and the output port receives the response output signal of the device under test. The input port and the output port of the network analyzer are usually organized such that either port can be switched to the other by a switching operation in the network analyzer. An example of configuration of such a network analyzer is shown in a block diagram of FIG. 1.

The configuration and operation of the network analyzer shown in FIG. 1 is briefly explained. A network analyzer 10 has two input-output ports P1 and P2 which are connected to directional bridges (or directional couplers) 11 and 12, respectively. Each of the bridges 11 and 12 functions as a signal separation circuit. A test signal from a signal generator 15 is sent to one of either the bridge 11 or bridge 12 which is selected by a switch 13. The test signal (sweep frequency signal) is sent from the selected one of the port P1 or port P2 to the device under test. The test signal from the signal generator 15 is also sent to the inside of the network analyzer as a reference signal. Namely, this reference signal and the input signal from the bridge 11 or 12 are respectively provided to frequency converters 17, 18 and 19 whereby converted to signals of a lower frequency.

The frequency converted input signal and the reference signal are respectively converted to digital signals by AD converter 21, 22 and 23. The digital signals are processed by a digital signal processor (DSP) 25 to determine S-parameters of the device under test. The S-parameters or other data derived from the S-parameters are displayed by a display 29 in various formats under the control of a CPU 28 which controls the overall operation of the system.

The devices to be tested, for example, components such as used in communication devices and systems, are sometimes formed with not only two terminals but also three or more terminals (hereinafter may also be referred to as "multi-port device"). In order to measure the S-parameters of the multi-port devices, an S-parameter test set having three or more ports may be used in combination with the network analyzer having two ports. Such an example is shown in FIG. 2 wherein a three port DUT is connected to a three port S-parameter test set having three ports.

In using the three port test set of FIG. 2, before connecting the DUT to test ports 90, 92 and 94, the test set is preferably calibrated to test the DUT with high accuracy. Typically, such a calibration process is conducted by using a predetermined two port calibration set between the test ports 90 and 92, between the test ports 92 and 94, and between the test ports 94 and 92. Then the DUT is connected to the test set and the S-parameters are measured.

The process for measuring the S-parameters of three port device with use of the conventional network analyzer is described in more detail. FIG. 3 is block diagram showing an example of network analyzer designed for three port device testing. The network analyzer 200 of FIG. 2 includes a three port test set therein, and thus functions in the same manner as the example of FIG. 2.

The network analyzer 200 includes a signal source 210 which is a sweep frequency signal, switches 212, 214, 216, 218 and 220, each having two switching circuits (designated by circle 1 and circle 2), a receiver circuit 222 and three direction bridges (couplers) 230, 232 and 234. The receiver circuit 222 includes three measurement units 224, 226 and 228. The receiver circuit 222 of FIG. 3 thus corresponds to the frequency converters 17, 18, 19 and the A/D converters 21, 22, 23 and the DSP 25 of FIG. 1. The measurement unit 228 is to measure a signal level of the signal source 210, i.e., a reference level "R". The other measurement units 224 and 226 are to measure signal levels of output signals (transmission signal and/or reflection signal) from the device under test. In this example, measured results based on the voltage ratio between the measurement units 224 and 228 is denoted as "measurement A" and measured results based on the voltage ratio between the measurement units 226 and 228 is denoted as "measurement B".

FIG. 4 is a table showing between types of S-parameters and switch settings and number of signal sweep operation when testing the S-parameters of the three port device 40 by the network analyzer of FIG. 3. In FIG. 4, labels SW1–SW5 correspond to the switches 212–220, respectively. When the switching circuit (circle 1 or circle 2) in the switch is ON, it is connected to a path to other circuit components, and when the switching circuit is OFF, it is connected to the ground through a terminal resistor.

The three port device (DUT) 300 is connected to test ports 240, 242 and 244 of the network analyzer 200. First, the switch setting is made so that the test signal is provided to the DUT 300 through the test port 240. Under this condition, the network analyzer 200 measures S-parameters S11, S21 and S31 of the DUT 300. For example, for measuring S-parameter S11, the test (sweep frequency) signal 210 is supplied to the DUT 300 through the switch 212 (SW1) and the test port 240. At the same time, a reflected signal from an input terminal (1) of the DUT 300 is received by the measurement unit 224 through the directional bridge 230 and the switch 216 (SW3) to conduct the "measurement A". Also at the same time, for measuring S-parameter S21, a transmission signal from a terminal (2) of the DUT 300 is received by the measurement unit 226 through the bridge 232 and the switches 218 (SW4) and 220 (SW5) to conduct the "measurement B". Thus, S-parameters S11 and S21 can be measured by a single sweep of the test signal 210.

For measuring S-parameter S31, while applying the test signal 210 to the terminal (1) of the DUT 300 through the test port 240, a transmission signal from the terminal (3) of the DUT 300 is measured. Thus, the switch 5 is changed its connection so that the transmission signal from the terminal (3) of the DUT 300 is received by the measurement unit 226 through the directional bridge 234 and the switch 220. As in the foregoing, for measuring S-parameters S1, S21 and S31, the sweep signal must be applied to the terminal (1) by two times as shown in the left column of FIG. 4.

In a similar manner, by applying the test signal to the terminal (2) of the DUT 300, the network analyzer 200 measures S-parameters S12, S22 and S32 of the DUT 300 under the settings shown in the center column of FIG. 4. The network analyzer 200 further measures S-parameters S13, S23 and S33 of the DUT 300 under the settings shown in the right column of FIG. 4. Thus, all of the S-parameters are measured in the forgoing procedure and conditions.

In the measurement by the three port test set of FIG. 2 or the three port network analyzer 200 of FIG. 3, however, there is a problem in that the measurement accuracy of a three port device under test is not high enough even after conducting the calibration procedure between two test ports (two port calibration). More specifically, two port calibration will be conducted between the test ports 90 and 92 (240 and 242), the test ports 92 and 94 (242 and 244), and the test ports 94 and 90 (244 and 240) before testing the DUT. However, by the calibration procedure above, although error coefficients between the two test ports can be removed, error coefficients in the third test port are not fully calibrated. For example, in the calibration between the test ports 90 and 92 (240 and 242), the error at the test port 94 under the situation is not measured.

Other problem involved in measuring the S-parameters by the conventional test set or network analyzer 200 as noted above is that it requires a considerably long time to complete the measurement. For example, as shown in the table of FIG. 4, for measuring each set of three S-parameters, the sweep test signal must be applied to the DUT by two times. Thus, for obtaining all of the nine S-parameters, the test signal sweep must be repeated six times, resulting in a long time for completing the measurement.

A further problem is directed to a signal loss, i.e., a measurement dynamic range. Since the example of FIG. 3 includes the switches 218 which is series connected to the switch 216 or 220 for transmitting the signal from the DUT, a signal loss will be incurred before the signal reaching the measurement units 224 or 226. Such a signal loss decreases a measurement dynamic range or measurement sensitivity in the network analyzer.

In testing the three port device (DUT) by a two port network analyzer (FIG. 5A) or through a two port test set (FIG. 5B), the third terminal of the DUT is must be terminated through a resistor of known value. Before the S-parameter measurement, the two port calibration is performed between two test ports P1 and P2 (Q1 and Q2). Then, two ports of the DUT are connected to the test ports of the network analyzer (FIG. 5A) or the test set (FIG. 5B) while the remaining port of the DUT is connected to a resistor R. Under this condition, S-parameters of the two ports of the DUT are measured. Then, by connecting the next two ports of the DUT to the test ports and connecting the resistor R to the remaining port of the DUT, S-parameters are measured. By repeating the similar process by one more time, all of S-parameters can be obtained.

In the measurement by using the two port network analyzer of FIG. 5A or two port test set of FIG. 5B noted above, connections between the DUT and the network analyzer (test set) and resistor R have to be manually changed many times. Therefore, this test method is disadvantageous in that it is complicated and time consuming. Moreover, in the case where the resistor R is deviated from the ideal value, a reflection at the port of the resistor R may occur, resulting in errors in the measurement of the S-parameters.

SUMMARY OF THE INVENTION

Therefore, it is an object of the present invention to provide a multi-port device analysis apparatus and method which is capable of accurately measuring parameters of a multi-port device having three or more ports with high efficiency and accuracy.

It is another object of the present invention to provide a multi-port device analysis apparatus calibration method which is capable of detecting error coefficients of the analysis apparatus and compensating such error coefficients in the measurement of the multi-port device.

It is a further object of the present invention to provide a multi-port device analysis apparatus and method for measuring various parameters of a multi-port device with high efficiency and high dynamic range without changing the connections changes between the multi-port device under test and the analysis apparatus.

It is a further object of the present invention to provide a three port device analysis apparatus and a calibration method thereof for measuring S-parameters of a three port device with high efficiency and high accuracy and high dynamic range.

It is a further object of the present invention to provide a three port device analysis apparatus with use of a two port network analyzer for measuring S-parameters of a three port device with high efficiency and high accuracy.

In order to test the multi-port device having three or more ports, the multi-port device analysis apparatus of the present invention is comprised of: a signal source for providing a test signal to one of terminals of a multi-port device under test (DUT); a plurality of test ports for connecting all of the terminals of the multi-port DUT to the corresponding test ports; a plurality of measurement units for measuring signals from the corresponding test ports connected to the corresponding terminals of the multi-port DUT; a reference signal measurement unit for measuring the test signal for obtaining reference data relative to measurement of the signals from the test port by the plurality of measurement units; a plurality of terminal resistors each being assigned to one of the test ports; and switch means for selectively providing the test signal to one of the test ports (input port) and disconnecting the terminal resistor from the test port provided with the test signal (input port) while connecting the terminal resistors to all the other test ports; wherein parameters of the multi-port DUT are acquired without changing the connections between the test ports and the terminals of the DUT, while changing selection of the test port until all of the test port being assigned as the input port.

According to the present invention, since the multi-port device analysis apparatus of present invention has the number of ports that can connect all of the ports of the multi-port DUT, once the DUT is fully connected, there is no need to change the connection between the analysis apparatus and the DUT. Further, the multi-port device analysis apparatus is provided with a terminal resistor at each test port (for receiving signal from the DUT), and each terminal resistor is included in both the calibration stage and the S-parameter measurement stage. Thus, the accurate measurement can be achieved even when the terminal resistors are deviated from the ideal value.

BRIEF DESCRIPTION OF THE DRAWINGS

FIG. 4 is a table showing types of S-parameters and switch settings and the like when testing the S-parameters of the three port device by the network analyzer of FIG. 3.

FIG. 7 is a table showing relationship between types of S-parameters and switch settings when testing a three port device by the apparatus of FIG. 6.

FIG. 9 is a table showing measurement modes in the three port device analysis apparatus of FIG. 8.

FIG. 10 (a) shows a signal flow model for the test port designated by "S" in the table of FIG. 9, and FIG. 10(b) shows a signal flow model for the test port designated by "R" in the table of FIG. 9.

FIG. 16 is a table showing measurement modes in the analysis apparatus of FIG. 15.

DETAILED DESCRIPTION OF THE EMBODIMENTS

Figure 6:
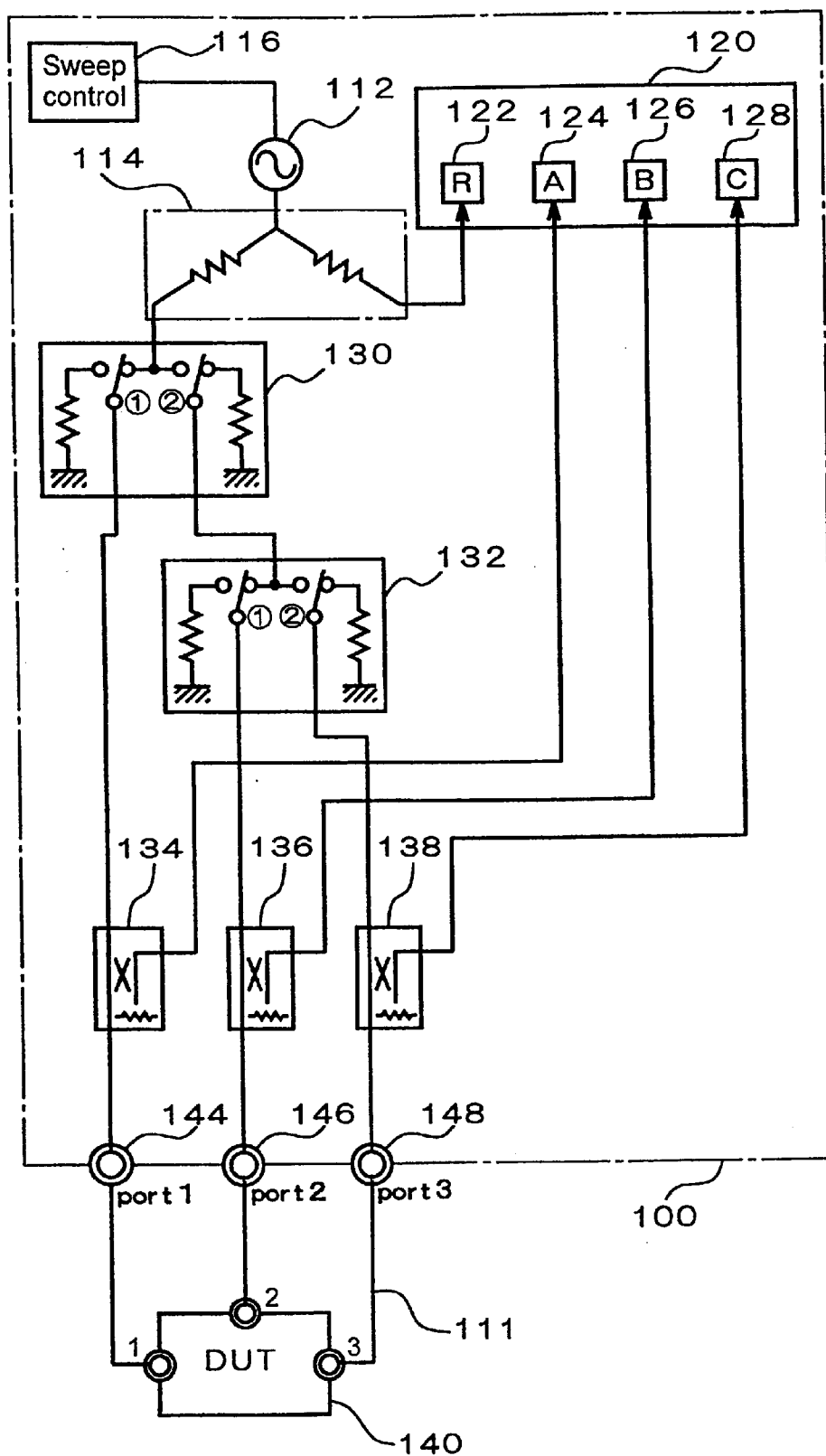
FIG. 6 is a block diagram showing a three port network analyzer as a first embodiment of the multi-port device analysis apparatus of the present invention.

The preferred embodiments of the present invention will be described with reference to the drawings. The first embodiment of the multi-port device analysis apparatus of the present invention will be described with reference to FIGS. 6–13 which is directed to the three port analysis apparatus. The three port analysis apparatus of FIG. 6 is a network analyzer 100 having a three port test set in the same housing. The network analyzer 100 includes a signal source 112, a power divider 114, a receiver circuit 120 having measurement units 122, 124, 126 and 128, switches 130 and 132 each having two switch circuits and terminal resistors (normalized impedance), and directional bridges (or couplers) 134, 136 and 138.

The signal source 112 generates a test signal whose frequency is linearly changed within a predetermined range in response to a control signal from a sweep controller 116. The power divider 114 divides the power of the test signal from the signal source 112 and provides the test signal to the selected terminal of the three port DUT 140 through the switches 130 and 132 and to the measurement unit 122 in the receiver circuit 120.

Figure 1:
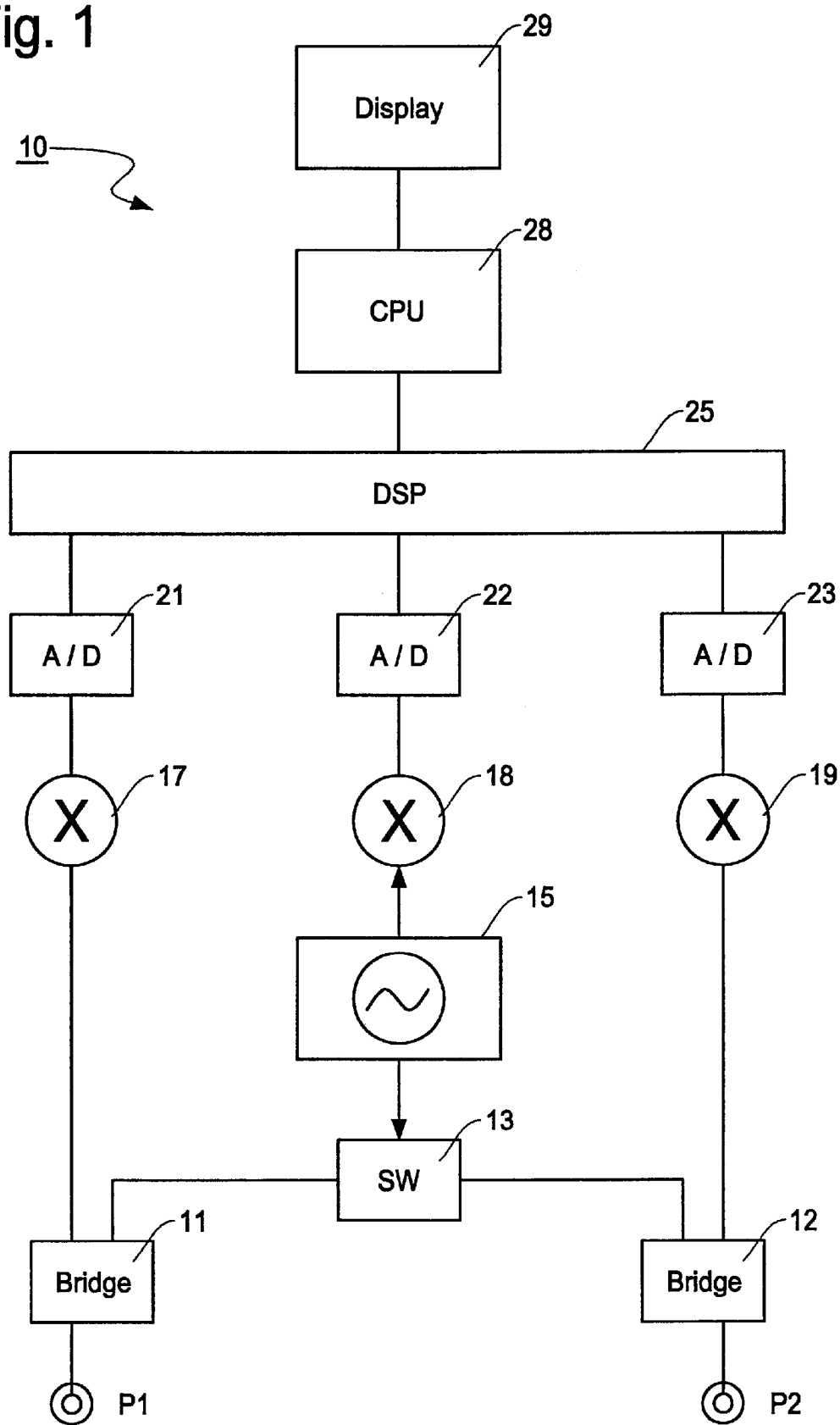
FIG. 1 is a block diagram showing an example of structure in a network analyzer having two test ports.
Figure 2:
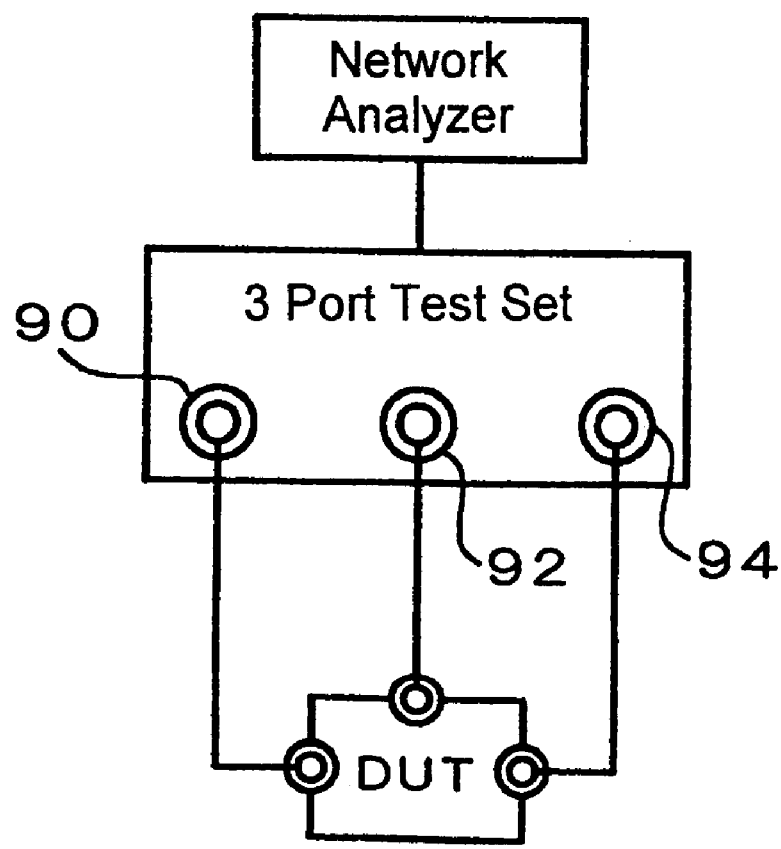
FIG. 2 is a schematic diagram showing an example of structure for measuring a three port device by a combination of a network analyzer and a three port test set in the conventional technology.
Figure 3:
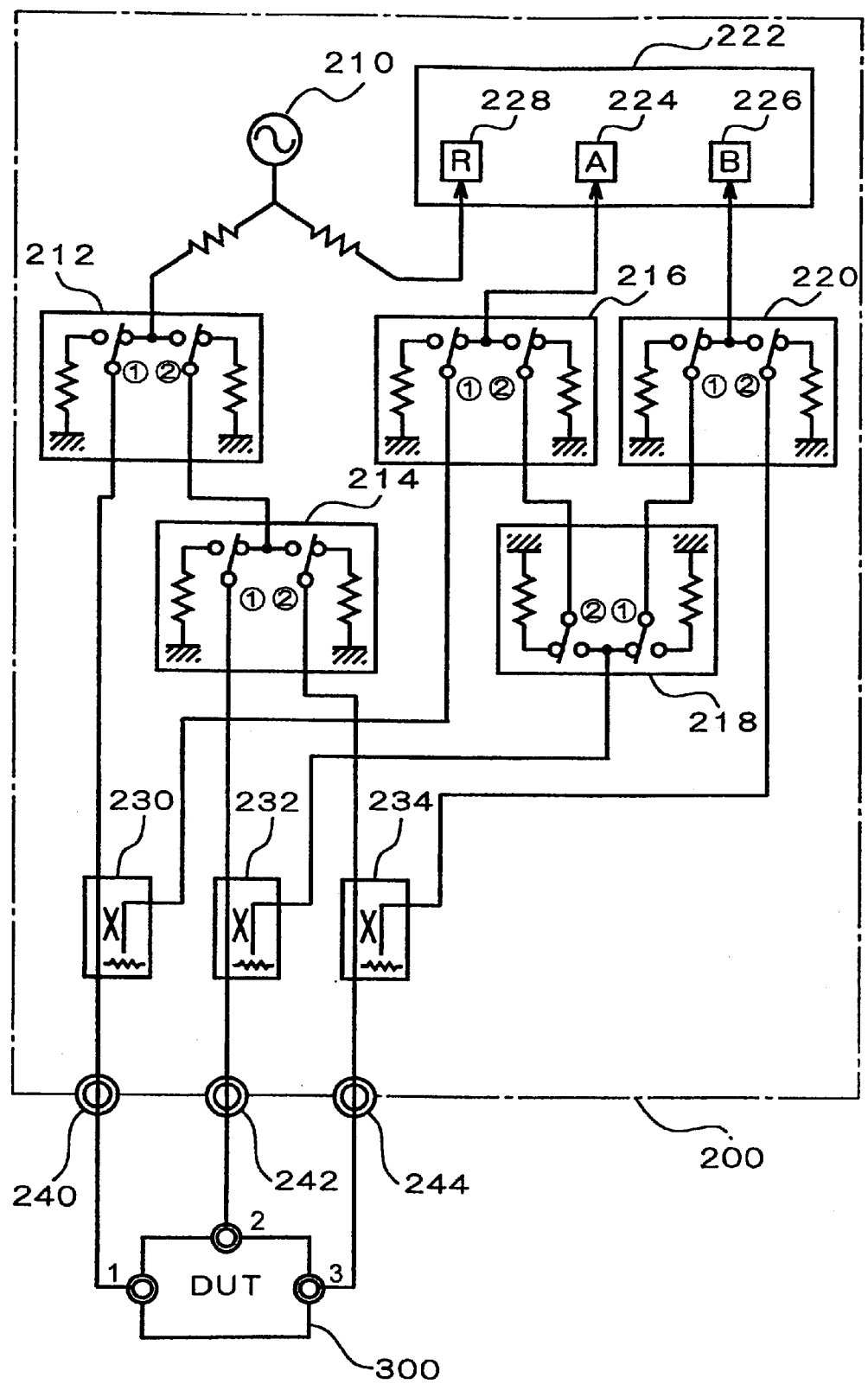
FIG. 3 is a schematic block diagram showing an example of configuration of a network analyzer having a three port test set therein for analyzing a three port device.
Figure 5A:
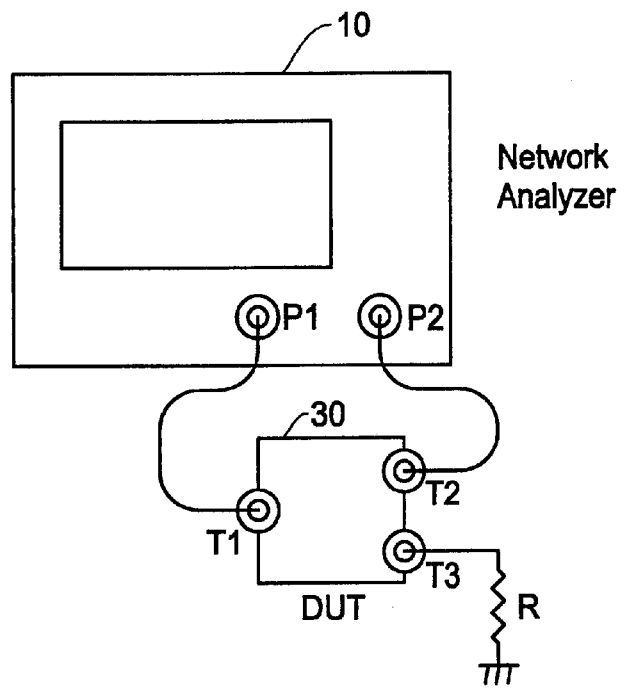
FIG. 5A is a schematic diagram showing a basic structure for measuring a three port device by a two port network analyzer.
Figure 5B:
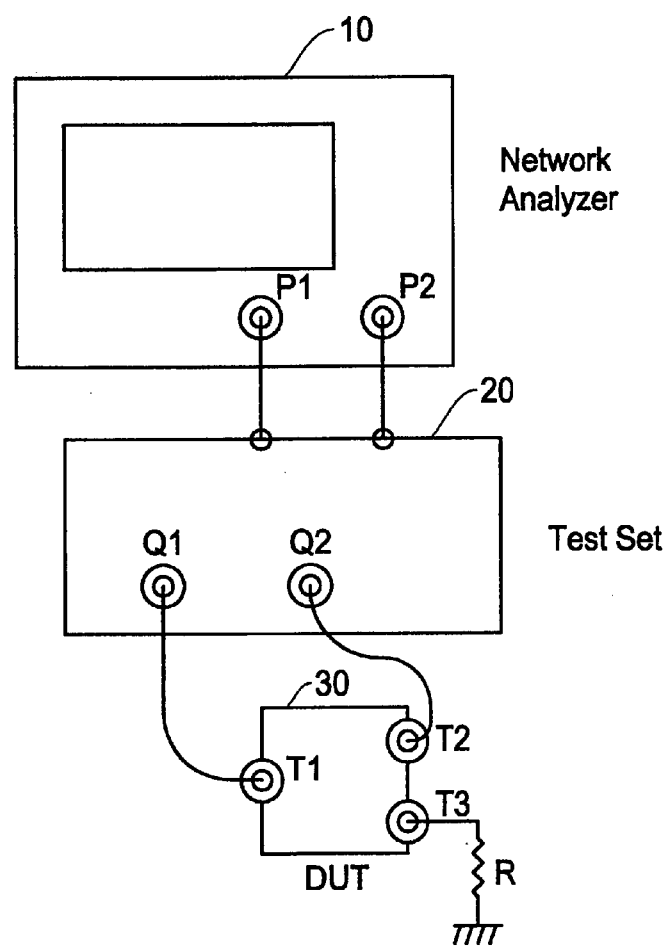
FIG. 5B is a schematic diagram showing a basic structure for measuring a three port device by a two port test set.

The receiver circuit 120 has four measurement units 122, 124, 126 and 128. Each measurement unit may be configured by a frequency converter, an A/D converter, and a signal processor such as shown in FIG. 1. The measurement unit 122 is to measure a signal level of the signal source 112, i.e., a reference level "R". The other measurement units 124, 126 and 128 are to measure signal levels of output signals (transmission signal and/or reflection signal) from the three port DUT 140. In this example, measured results based on the voltage ratio between the measurement units 122 and 124 is denoted as "measurement A" and measured results based on the voltage ratio between the measurement units 122 and 126 is denoted as "measurement B". Further, measured results based on the voltage ratio between the measurement units 122 and 128 is denoted as "measurement C".

Each of the switches 130 and 132 includes two switching circuits designated by circles 1 and 2 in FIG. 6 to connect the circuit either to an external signal path or to the inner terminal resistor. Each terminal resistor in the switches 130 and 132 is set to characteristic (normalized) impedance of the DUT 140 and the network analyzer which is typically 50 ohms. Thus, the switches 130 and 132 function to supply the test signal to a selected input port of the three port DUT and terminates the other ports of the DUT.

The directional bridges (or directional couplers) 134, 136 and 138 transmit the test signal from the switches 130 and 132 to the DUT and detect signals from the DUT (transmission signal and/or reflection signal) and provide the detected signals to the receiver circuit 120. The detected signal from the directional bridge 134 is provided to the measurement unit 124, the detected signal from the directional bridge 136 is provided to the measurement unit 126, and the detected signal from the directional bridge 138 is provided to the measurement unit 128.

FIG. 7 is a table showing relationship between types of S-parameters and switch settings and number of signal sweep when testing the S-parameters of the three port DUT 140 by the network analyzer of FIG. 6. In FIG. 7, labels SW1 and SW2 correspond to the switches 130 and 132, respectively. In the table, when the switch circuit (represented by circle 1 or circle 2) is ON, it means that the switch circuit is connected to the external circuit components, and when the switch circuit is OFF, it means that the switch circuit is connected to the ground through the terminal resistor.

The three port DUT 140 is connected to test ports 144, 146 and 148 of the network analyzer 100. First, the switch 130 is set so that the test (sweep frequency) signal is provided to a port (1) of the DUT 140 through the directional bridge 134 and the test port 144. Under this condition, the network analyzer 100 measures S-parameters S11, S21 and S31 of the DUT 140. A reflected signal from the port (1) of the DUT 140 is received by the measurement unit 124 through the directional bridge 134 to determine S-parameter S11 (measurement A). For measuring S-parameter S21, a transmission signal from a port (2) of the DUT 140 is received by the measurement unit 126 through the directional bridge 136 (measurement B). For measuring S-parameter S31, a transmission signal from a port (3) of the DUT 140 is received by the measurement unit 128 (measurement C). Thus, three S-parameters S11, S21 and S31 are measured at the same time by a single sweep of the test signal.

Then, the switches 130 and 132 are set as in the center column of FIG. 7 so that the test (sweep frequency) signal is provided to the port (2) of the DUT 140 through the directional bridge 136 and the test port 146. Under this condition, the network analyzer 100 measures S-parameters S12, S22 and S32 of the DUT 140. A transmission signal from the port (1) of the DUT 140 is received by the measurement unit 124 through the directional bridge 134 for measuring S-parameter S12 (measurement A). A reflection signal from the port (2) of the DUT 140 is received by the measurement unit 126 through the directional bridge 136 for measuring S-parameter S22 (measurement B). A transmission signal from the port (3) of the DUT 140 is received by the measurement unit 128 for measuring S-parameter S31 (measurement C). Thus, three S-parameters S12, S22 and S32 are measured at the same time by a single sweep of the test signal.

Next, the switches 130 and 132 are set as in the right column of FIG. 7 so that the test (sweep frequency) signal is provided to the port (3) of the DUT 140 through the directional bridge 138 and the test port 148. Under this condition, the network analyzer 100 measures S-parameters S13, S23 and S33 of the DUT 140. A transmission signal from the port (1) of the DUT 140 is received by the measurement unit 124 through the directional bridge 134 for measuring S-parameter S13 (measurement A). A transmission signal from the port (2) of the DUT 140 is received by the measurement unit 126 through the directional bridge 136 for measuring S-parameter S23 (measurement B). A reflection signal from the port (3) of the DUT 140 is received by the measurement unit 128 from the directional bridge 138 for measuring S-parameter S33 (measurement C). Thus, three S-parameters S13, S23 and S33 are measured at the same time by a single sweep of the test signal.

As in the foregoing, the network analyzer of the present invention has the same number of measurement units 124, 126 and 128 (other than the measurement unit 122 for the reference test signal) as the number of ports of the DUT 140. Three signals (one reflection signal and two transmission signals) from the corresponding three ports of the DUT 140 are evaluated at the same time by a single sweep of the test signal. Therefore, all (nine) S-parameters of the DUT 140 can be measured by only three sweeps of the test signal.

Further, since each pair of measurement unit and direction bridge is assigned to a port of the DUT, the three signals from the DUT are transmitted to the corresponding measurement units without using switches or changing connections in the transmission paths. Thus, signal loss in the transmission path is substantially reduced, thereby achieving a wider measurement dynamic range.

Figure 8:
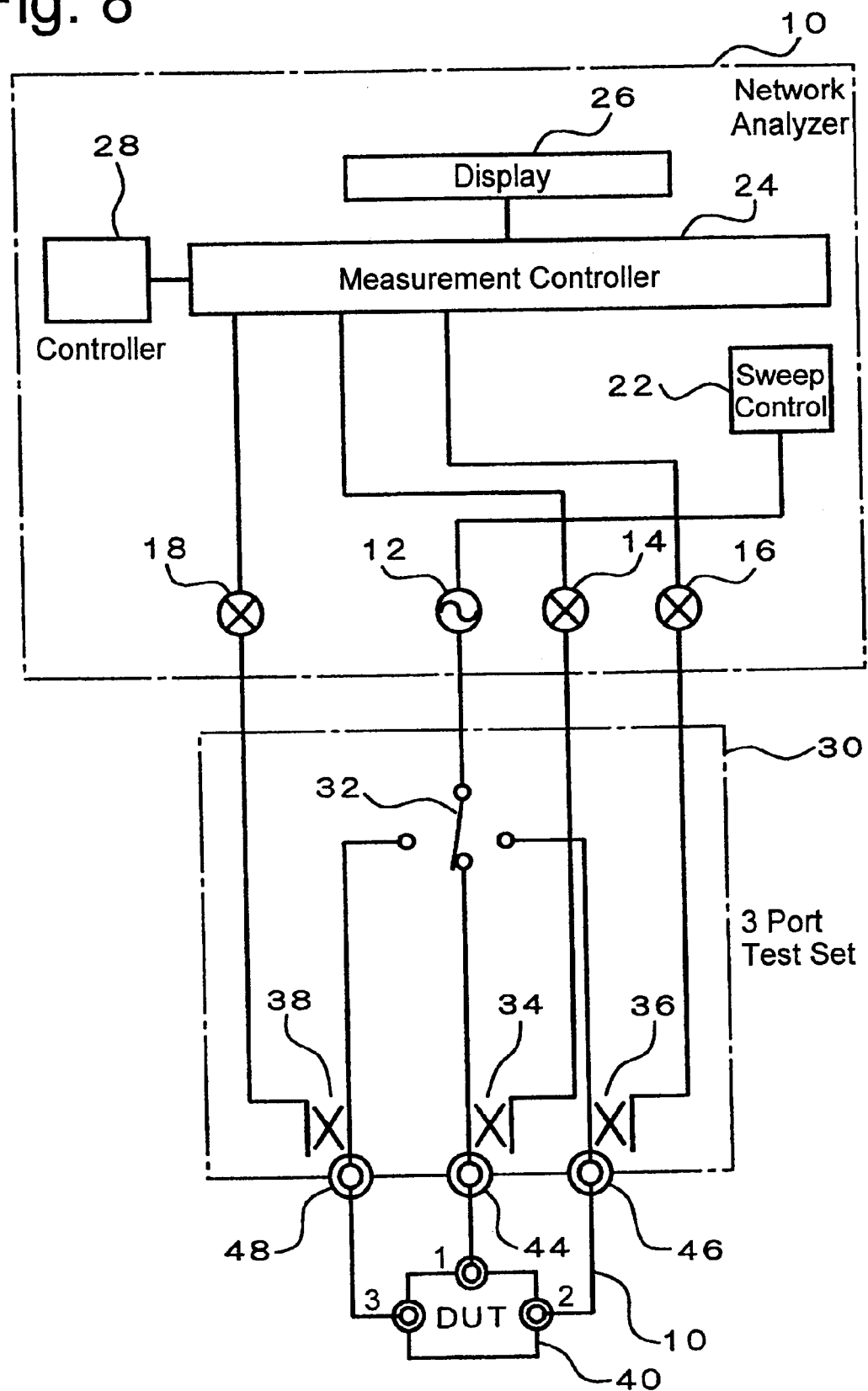
FIG. 8 a schematic block diagram showing a three port device analysis apparatus which is a combination of a three port network analyzer and a three port test set in the first embodiment of the present invention.

The calibration method of the present invention is described with reference to FIGS. 8–13. FIG. 8 a schematic block diagram showing a three port analysis apparatus which is a combination of a three port network analyzer 10 and a three port test set 30. Although the example of FIG. 8 has the network analyzer and test set separately, the structure of this apparatus is the same as that of the network analyzer of FIG. 6 having the test set in the same housing.

In FIG. 8, the network analyzer 10 includes a signal source 12, a sweep controller 22, three measurement units 14, 16 and 18, a measurement controller 24, a display 26 and a controller 28. The signal source 12 generates a sine wave test signal under the control of the sweep controller 22. For example, the signal source 12 and the sweep controller 22 form a frequency synthesizer whereby generating a test signal whose frequency changes linearly (sweep) within a predetermined range. When testing a three port device (DUT) 40, the test signal is provided to a port of the DUT 40 selected by a switch 32 (in the test set 30). The measurement units 14, 16 and 18 correspond to the measurement units 124, 126 and 128 in the network analyzer of FIG. 6.

The measurement controller 24 controls an overall operation of the network analyzer 10 including performing a calibration procedure to determine error coefficients of the overall analysis apparatus and compensating the error coefficients to obtain the S-parameters of the DUT with high accuracy. The display 26 illustrates various measurement conditions and measurement results of the test parameters. The controller 28 includes various keys and switches and pointing devices to function as an interface with an operator of the apparatus.

The test set 30 includes a switch 32, three directional bridges (directional couplers) 34, 36 and 38, and three test ports 44, 46 and 48. Three ports of the device under test (DUT) 40 are connected to the corresponding test ports through cables. The switch 32 selectively provides the test signal from the signal source 12 to one of the test ports 44, 46 or 48, i.e., one of the ports of the DUT 40. The directional bridges 34, 36 and 38 detect and transmit signals from the corresponding test ports, i.e., the ports of the DUT 40 to the corresponding measurement units 14, 16 and 18.

FIG. 9 is a table showing measurement modes in the analysis apparatus of FIG. 8. This table shows as to which test port of the test set 30 provides the test signal to the DUT and which test ports receive signals from the DUT. For example, in the mode a, the test port 44 functions as a signal source "S" and the test ports 46 and 48 function as receivers "R" to send the received signals to the measurement units 16 and 18. It should be noted, however, that since the reflection signal from the DUT through the test port 44 is also received by the measurement unit 14, the label "S" in the table means both signal source and receiver. Thus, S-parameters S11, S21 and S31 of the DUT are measured in the mode a, S-parameters S12, S22 and S32 of the DUT are measured in the mode b, and S-parameters S13, S23 and S33 of the DUT are measured in the mode c.

With reference to signal flow graphs of FIGS. 10 and 11, error factors involved in the measurement modes a–c in the table of FIG. 9 are described in the following. FIG. 10(a)

shows a signal flow model for the test port designated by "S" in the table of FIG. 9, and FIG. 10(b) shows a signal flow model for the test port designated by "R" in the table of FIG. 9. Each of the test ports 44, 46 and 48 is designated by two nodes, nodes 50 and 52 in FIG. 10(a) and nodes 54 and 56 in FIG. 10(b).

As shown in FIG. 10(a), with respect to the test port connected to the signal source 12, the test signal from the signal source 12 is input to the node 50. At the same time, a part of the test signal is transmitted to the other test port in the "R" mode such as through the directional bridges in the test set 30 (Ed: directivity). The reflection signal from the DUT 40 is input to the reflection node 52. At the same time, a part of the reflection signal is transmitted to the "R" mode test port (Er: reflection tracking) and another part of the reflection signal is reflected back by the test port or other components in the test set 30 and returns to the input node 50 (Es: source match).

As shown in FIG. 10(b), with respect to the test port connected to only the measurement unit, i.e., in the "R" mode, a signal from the DUT is received by the measurement unit. At the same time, a part of the signal from the DUT is input to the reflection node 54 and is transmitted to the "R" mode test port (Et: transmission tracking), and another part of the signal is reflected back by the test port or other components in the test set 30 and returns to the input node 56 (El: load match).

Figure 11:
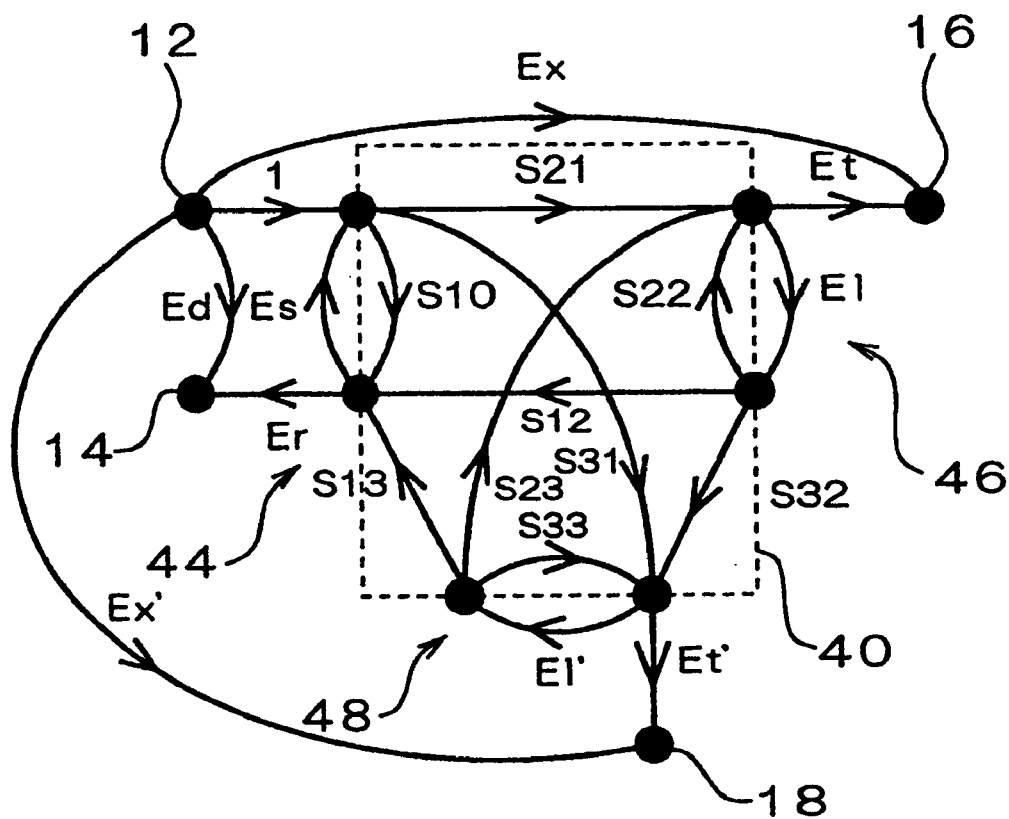
FIG. 11 is a signal flow graph when a device under test is connected to the test set in the three port device analysis apparatus of FIG. 8.

FIG. 11 is a signal flow graph when the DUT is connected to the test set 30 in the measurement mode a of FIG. 9. For the three port DUT 40, nine S-parameters S11, S12, S13, S21, S22, S23, S31, S32 and S33 will be defined where each parameter is an amplitude ratio expressed by complex numbers. S21 and S31 respectively represent the transmission coefficients from the test port 44 to the test port 46 and 48. S11 represents the reflection coefficient at the test port 44. Similarly, S32 and S12 respectively represent the transmission coefficients from the test port 46 to the test ports 48 and 44. S22 represents the reflection coefficient at the test port 46. S13 and S23 respectively represent the transmission coefficients from the test port 48 to the test ports 44 and 46. S33 represents the reflection coefficient at the test port 48. All of the S-parameters in the foregoing can be measured by measuring the voltages by the measurement units through the measurement modes a–c.

As noted with reference to FIGS. 10(a) and 10(b), and as also shown in FIG. 11, various error coefficients (terms) are involved in the S-parameter measurement. For example, in the measurement mode a, the test port 44 connected to both the signal source and the measurement unit 14 are associated with three error coefficients Ed, Es and Er. The test port 46 connected to the measurement unit 16 is associated with two error coefficients Et and El, and the test port 48 connected to the measurement unit 16 is associated with two error coefficients Et' and El'. Further, a part of the test signal from the test source 12 may leak within the test set 30 and reach the measurement units 16 and 18, thus, these leakage signals are also considered to be error coefficients (Ex, Ex': isolation).

Figure 12:
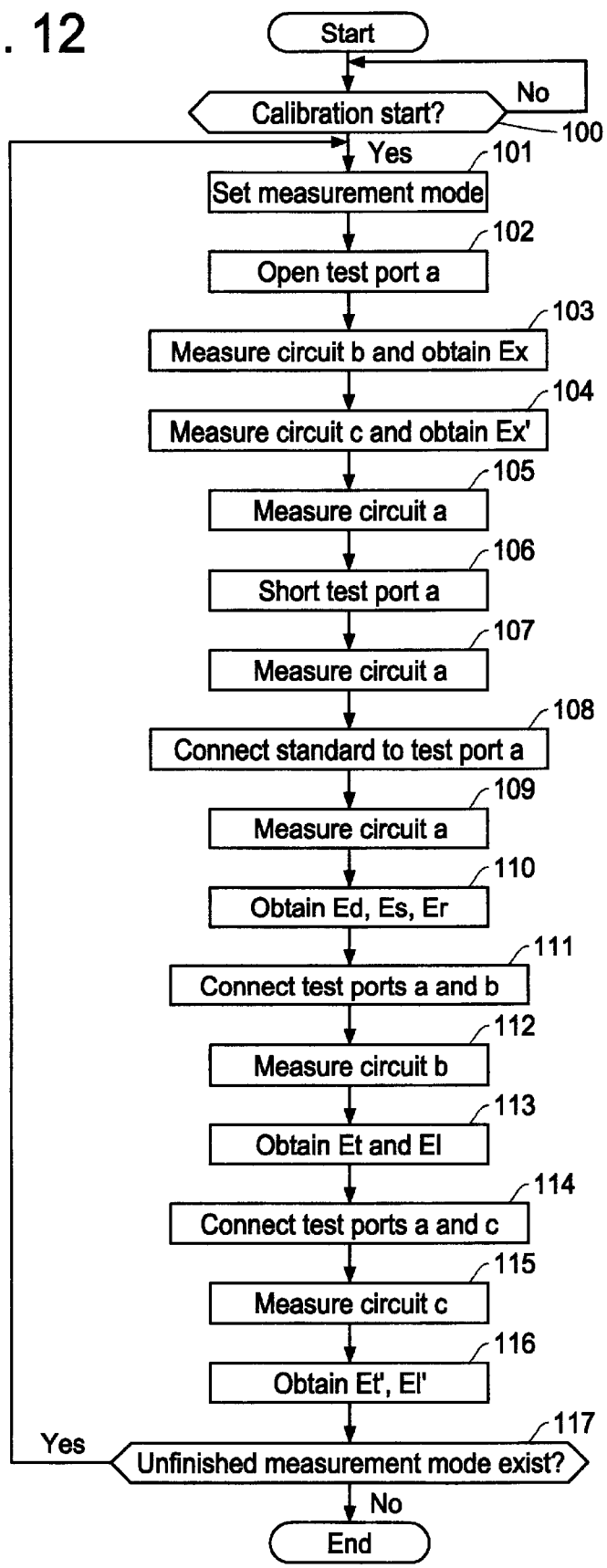
FIG. 12 is a flow chart showing a calibration process in the three port device analysis apparatus of the present invention shown in FIGS. 6 and 8.
Figure 13:
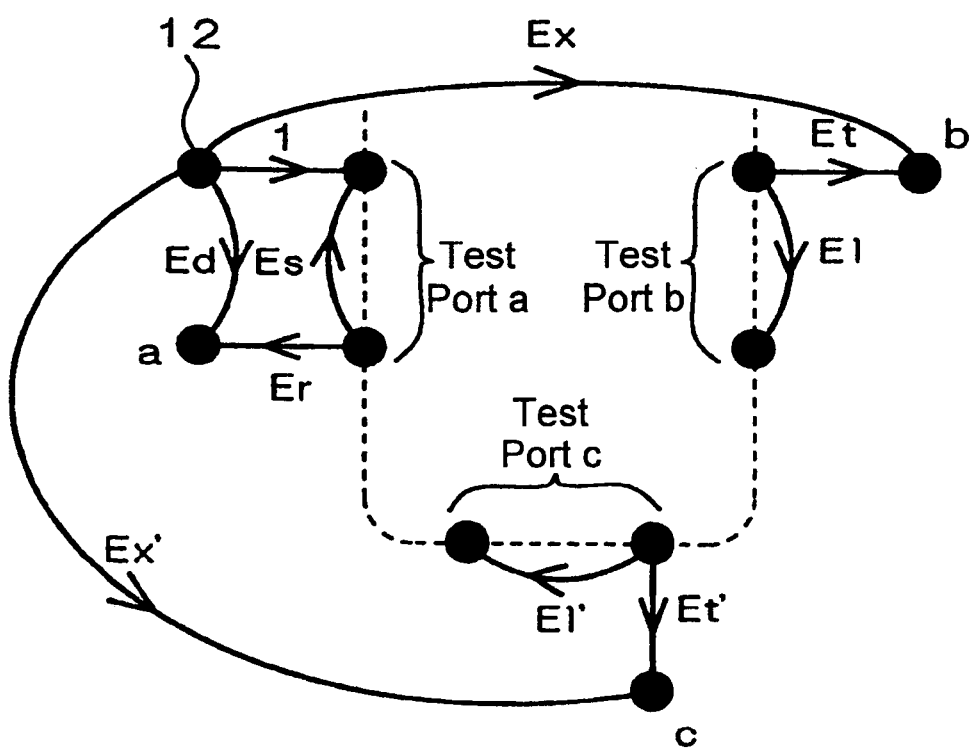
FIG. 13 shows a signal flow graph of the multi-port analysis apparatus of the present invention in the calibration process where the device under test is disconnected.

Therefore, these error coefficients (terms) must be detected and compensated for measuring the S-parameters of the DUT with high accuracy. FIG. 12 is a flow diagram showing such a calibration process in the three port device analysis apparatus of the present invention. During the calibration process, the DUT 40 is disconnected from the test ports of the analysis apparatus. FIG. 13 shows a signal flow graph of the analysis apparatus in the calibration process where the DUT is disconnected. In FIGS. 12 and 13, the test port connected to the signal source is represented by a "test port a" and the measurement unit corresponding to the "test port a" is denoted as a "circuit a". The test ports which are not connected to the signal source are represented by "test port b" and "test port c", respectively, and the measurement units corresponding to the test ports b and c are denoted by "circuit b" and "circuit c", respectively.

In the calibration process of FIG. 12, when the calibration process is initiated (step 100) by an operator through the controller 28, the switch 32 in the test set 30 selects one of the measurement mode (step 101). For example, the measurement mode a may be selected so that the signal source is provided to the test port 44 (test port a). Preferably, a calibration set having three modes of "open", "short" and "load" is used in the calibration process.

For measuring the error coefficients Ex and Ex', the measurement controller 24 sets the test port a to be "open" and provides the test signal of predetermined frequency from the test source to the test port a (step 102). Since the DUT is not connected, no signal is received by the test port 46, and the circuit b (measurement unit 16) can directly measure the error coefficient Ex which is a signal leaked from the signal source to the measurement unit 16 within the test set 30 (step 103). Similarly, by measuring a signal received by the circuit c (measurement unit 18), the error coefficient Ex' can be directly determined (step 104).

In the calibration process of FIG. 12, the error coefficients Ed, Es and Er are then determined as described below. Generally, for determining these error coefficients, the test port a (test port 44) is provided with three different conditions when the test signal is supplied thereto. A signal received by the circuit a (measurement unit 14) under each condition is evaluated, thereby obtaining three equations. The error coefficients Ed, Es and Er can be determined by solving the three equations.

For example, assuming the reflection coefficient of the test port 44 is S11, a voltage VR11 received by the circuit a (measurement unit 14) is expressed as follows:

$$VR11 = Ed + ErS11/(1-EsS11) \tag{1}$$

Typically, the above noted three different conditions include "open", "short" and "load" the test port 44. The "load" means that the test port 44 is connected to a terminal resistor having characteristic (normalized) impedance of the apparatus such as 50 ohms.

Thus, in the process of FIG. 12, by maintaining the open circuit of the test port a (44), a voltage at the circuit a (measurement unit 44) is measured (step 105). When the test port is open, the reflected signal has the same phase as that of the test signal, i.e., S11=1, the equation (1) is expressed as:

$$VR11 = Ed + Er/(1-Es) \tag{2}$$

In the next step, the test port a (44) is short circuited (step 106), and a voltage at the circuit a (measurement unit 44) is measured (step 107). When the test port is short, the reflected signal has the phase opposite to that of the test signal, i.e., S11=-1, the equation (1) is expressed as:

$$VR11 = Ed - Er/(1+Es) \tag{3}$$

In the next step, the test port a (44) is terminated by the normalized resistor (step 108), and a voltage at the circuit a (measurement unit 44) is measured (step 109). When the test port is terminated by the normalized (ideal) impedance, no reflection signal occurs, i.e., S11=0, thus, the equation (1) is expressed as:

$$VR11 = Ed \tag{4}$$

Thus, by solving the equations (1), (2) and (3) obtained in the above procedure, three error coefficients Ed, Es and Er can be determined (step 110).

The calibration process of FIG. 12 proceeds to the steps of determining the error coefficients Et and El. In the situation where the test ports 44 and 46 are connected in an ideal manner, a reflection coefficient at each of the test ports is zero, and a transmission coefficient at each of the test ports is one (1). Therefore, under this condition, voltages measured by the measurement units 14 and 16, respectively, are as follows:

$$VR11 = Ed + ErEl/(1-EsEl) \quad (5)$$

$$VR21 = Et/(1-EsEl) \quad (6)$$

Since the error coefficients Ed, Er and Es are know in the step 110 noted above, the error coefficient El can be determined by the equation (5), and based on this result and the equation (6), the error coef ficient El can be determined.

Figure 20:
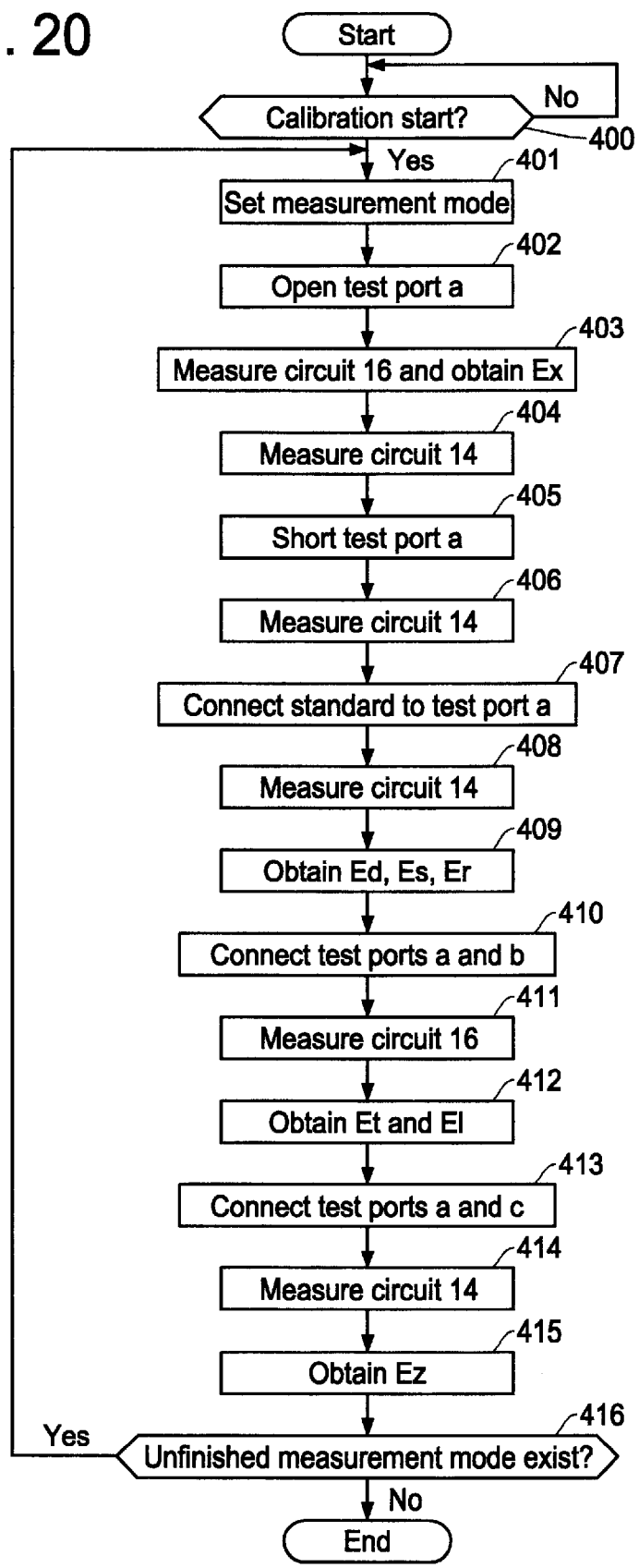
FIG. 20 is a flow diagram showing a calibration process in the multi-port (three port) analysis apparatus of the present invention shown in FIG. 15.

Thus, in the flow chart of FIG. 20, the test ports a (44) and b (46) are connected together (step 111), and a voltage VR11 at the circuit a (measurement unit 14) and a voltage VR21 at the circuit b (measurement unit 16) are measured (step 112). The calibration process applies the error coefficients Ed, Es and Er obtained in the step 110 noted above to the equations (5) and (6), thereby determining the error coefficients Et and El concerning the test port b (46) (step 113).

By the procedure similar to the steps 111–113, the error coefficients Et' and El' can also be determined. The test ports a (44) and c (48) are connected together (step 114), and a voltage VR11 at the circuit a (measurement unit 14) and a voltage VR31 at the circuit c (measurement unit 18) are measured (step 115). Under this condition, voltages measured by the circuit a (measurement units 14) and the circuit c (measurement unit 18), respectively, are as follows:

$$VR11 = Ed + ErEl'/(1-EsEl') \quad (7)$$

$$VR31 = Et'/(1-EsEl') \quad (8)$$

The process applies the error coefficients Ed, Es and Er obtained in the step 110 to the equations (7) and (8), the error coefficients Et' and El' concerning the test port c (48) can be determined (step 116).

In the foregoing process, the error coefficients involved in the measurement mode a (wherein the test signal is provided to the test port 44) are obtained. Then, the process inquires as to whether there is a remaining measurement mode whose error coefficients are not determined (step 117). In the foregoing example, since the measurement modes b and c are not evaluated as to the error coefficients, the process goes back to the step 101 to change the switch 32 in the test set 30 so that the test signal is supplied to the test port b (46). The procedures in the steps 101 to 117 are repeated until all of the error terms are collected for the measurement modes b and c. Then the calibration process ends.

As described in the foregoing, the error coefficients in the three port analysis apparatus for all of the measurement modes can be obtained. Thus, when measuring the S-parameters of the DUT by connecting the DUT to the apparatus, such error coefficients can be removed (compensated) during the calculation of the S-parameters. Consequently, the S-parameters of the three port DUT 40 can be obtained with high accuracy.

Since the multi-port device analysis apparatus of present invention has the number of ports that can be connected to all of the ports of the multi-port DUT, once the DUT is fully connected, there is no need to change the connection between the analysis apparatus and the DUT. Further, the multi-port analysis apparatus is provided with a terminal resistor at each port (signal receiving port), and each terminal resistor is included in both the calibration stage and the S-parameter measurement stage. Thus, the accurate measurement can be achieved even when the terminal resistors are deviated from the ideal value.

Figure 14:
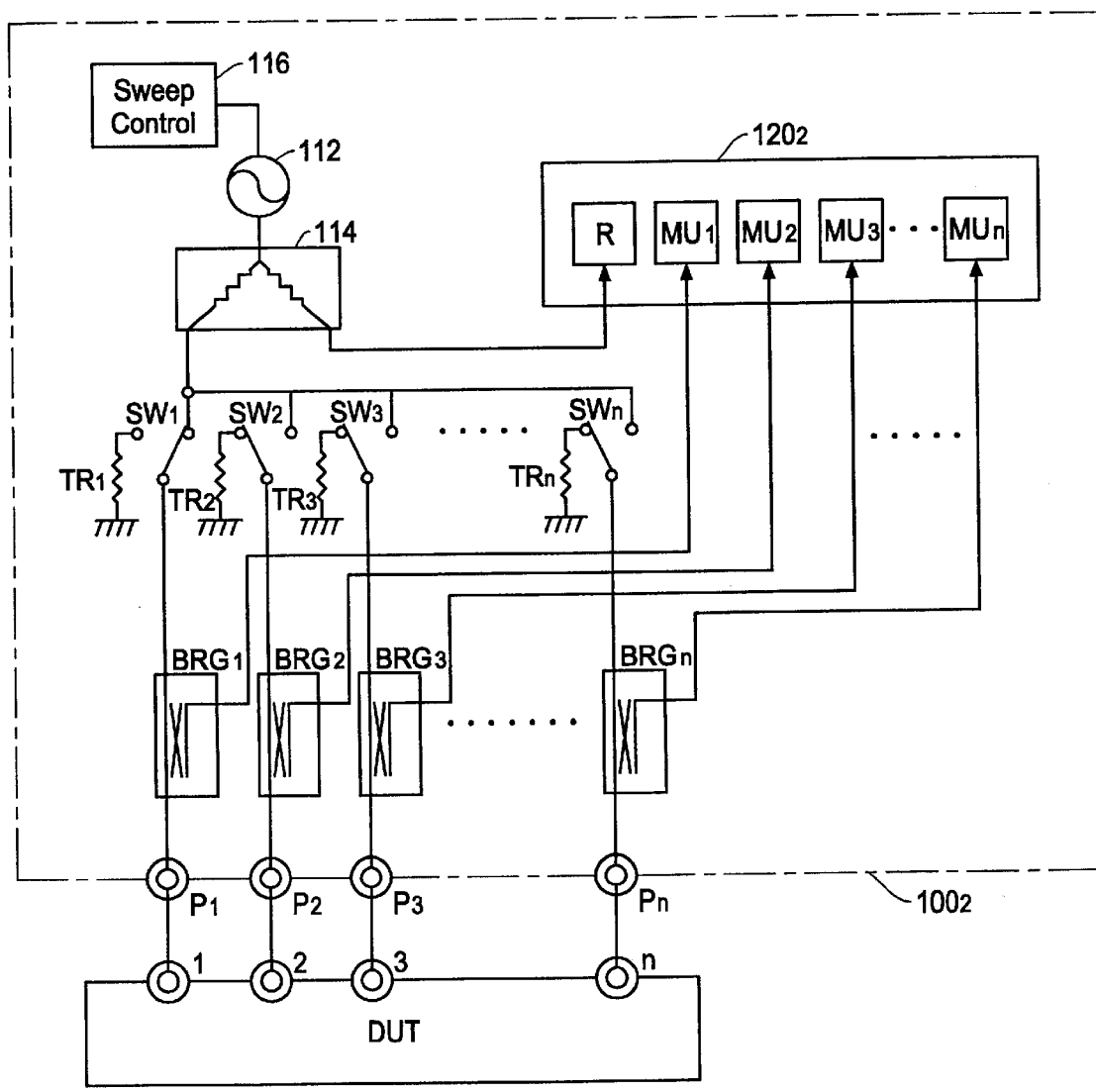
FIG. 14 is a block diagram showing an example of basic structure of a multi-port device analysis apparatus in the second embodiment having n test ports for measuring a multi-port device having n ports.

FIG. 14 is a block diagram showing a basic structure of the second embodiment of the multi-port device analysis apparatus of the present invention for measuring a multi-port device having n ports. In this example, the multi-port analysis apparatus has n test ports P1–Pn and a receiver circuit $120_2$ having n measurement units MU1–MUn (other than the measurement unit R for the reference test signal) for testing a multi-port device having n terminals (ports). The multi-port analysis apparatus of FIG. 14 further includes n directional bridges (couplers) BRG1–BRGn and n switches SW1–SWn, n terminal resistors TR1–TRn, a signal source 112, a power divider 114, and a sweep controller 116. As seen in FIG. 14, although the number of test ports, measurement units, switches and directional bridges are increased, the basic structure is the same as that of the examples of FIGS. 6 and 8.

The signal source 112 generates a test signal whose frequency is linearly changed within a predetermined range in response to a control signal from the sweep controller 116. The power divider 114 divides the power of the test signal from the signal source 112 and provides the test signal to the selected terminal of the n-port DUT through one of the switches SW1–SWn. The measurement unit R is to measure a signal level of the test signal from the signal source 112. The other measurement units MU1–MUn are to measure signal levels of output signals (transmission signal and/or reflection signal) from the corresponding port of the DUT.

Each of the switches SW1–SWn connects the corresponding test port and directional bridge to either the test source 112 or to the terminal resistor TR. When measuring S-parameters of the n-port DUT, one of the test ports P1–Pn is provided with the test signal from the test source 112, while all the other test ports are connected to the terminal resistors TR. Each of the terminal resistors TR1–TRn is set to normalized (characteristic) impedance of the analysis system and the DUT, which is typically 50 ohms. The directional bridges BRG1–BRGn transmit the signals (transmission signal and/or reflection signal) from the DUT to the corresponding measurement units MU1–MUn.

Before measuring the S-parameters of the DUT, the multi-port device analysis apparatus of FIG. 14 is calibrated to determine various error coefficients. The error coefficients and the procedure for determining such error coefficients are basically the same as that of the three port analysis device described in the foregoing. However, the number of the error coefficients and S-parameters will be greater than that of the first embodiment if the number of ports (n) of the DUT and the analysis apparatus is more than three.

Since the multi-port device analysis apparatus of present invention has the number of ports that can connect all of the ports of the multi-port DUT, once the DUT is fully connected, there is no need to change the connection between the analysis apparatus and the DUT. Further, the multi-port device analysis apparatus is provided with a terminal resistor at each test port (for receiving signal from the DUT), and each terminal resistor is included in both the calibration stage and the S-parameter measurement stage. Thus, the accurate measurement can be achieved even when the terminal resistors are deviated from the ideal value.

Figure 15:
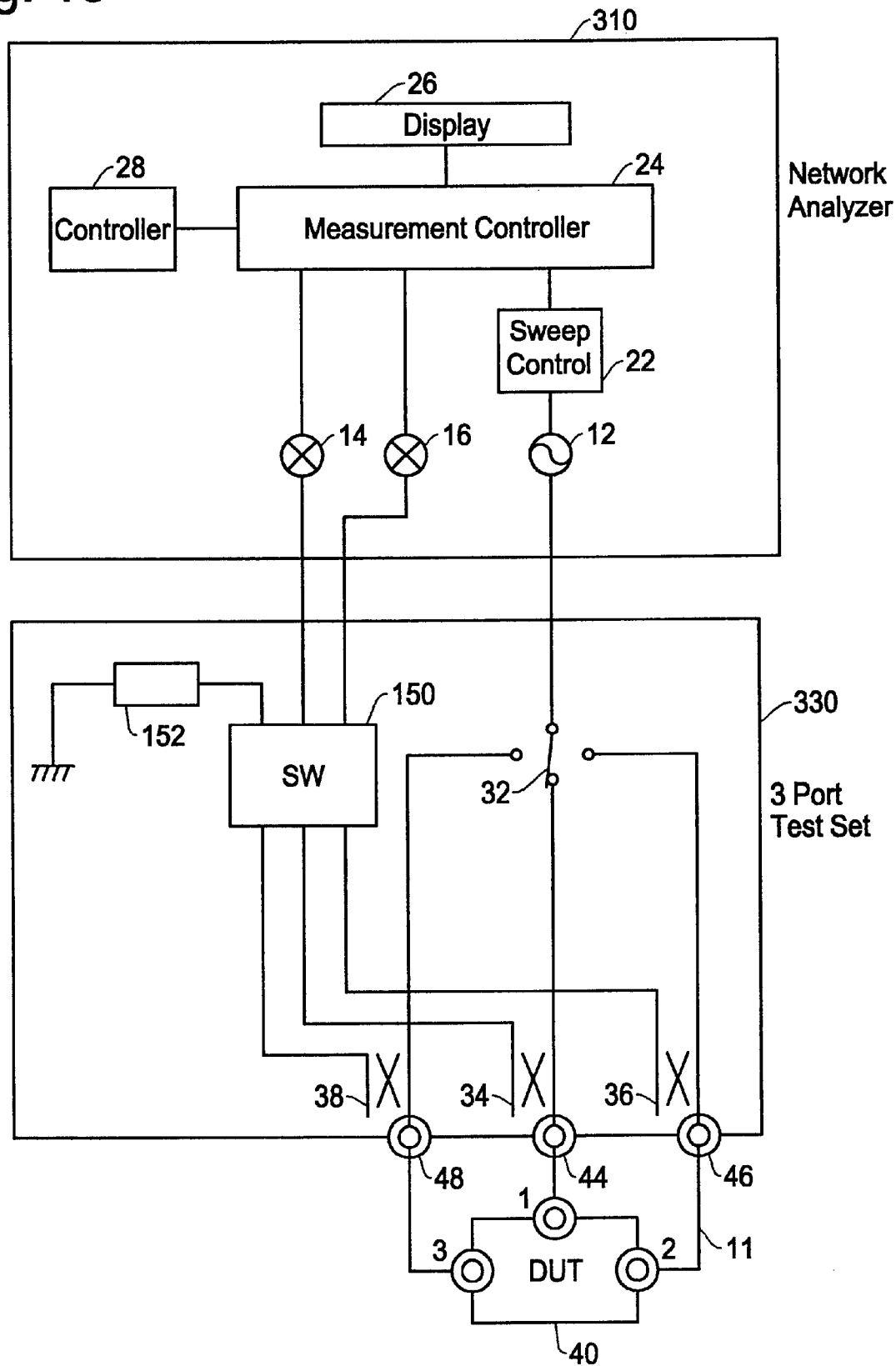
FIG. 15 is a block diagram showing an example of structure of a multi-port device analysis apparatus in the third embodiment using a two port network analyzer for measuring a three port device.

FIG. 15 is a block diagram showing a basic structure of the third embodiment of the multi-port device analysis apparatus for measuring a three port device. In this example, the multi-port analysis apparatus is a combination of a two port network analyzer and a three port test set. In FIG. 15, the network analyzer 310 includes a signal source 12, a sweep controller 14, two measurement units 14 and 16, a measurement controller 24, a display 26 and a controller 28. The signal source 12 generates a sine wave test signal under the control of the sweep controller 14. When testing a three port device under test (DUT) 40, the test signal is provided to a port of the DUT 40 selected by a switch 32 (in the test set 330).

The measurement controller 24 controls an overall operation of the network analyzer 310 including performing a calibration procedure to determine error coefficients of the overall analysis apparatus and compensating the error coefficients to obtain the S-parameters of the device under test with high accuracy. The display 26 displays various measurement conditions and measurement results of the test parameters. The controller 28 includes various keys and switches and pointing devices to function as an interface with an operator of the apparatus.

The test set 330 includes a switch 32, three directional bridges (directional couplers) 34, 36 and 38, and three test ports 44, 46 and 48, a switch 150 and a terminal resistor 152. Three ports of the device under test (DUT) 40 are connected to the corresponding test ports through cables. The switch 32 selectively provides the test signal from the signal source 12 to one of the test ports 44, 46 or 48, i.e., one of the ports of the DUT 40.

The directional bridges 34, 36 and 38 detect and transmit signals from the corresponding test ports, i.e., the ports of the DUT 40 to the two measurement units 14 and 16. Since the network analyzer 310 has only two measurement units 14 and 16, a signal from one of the directional bridges is provided to the terminal resistor 152. Such a selection is made by the switch 150. The terminal resistor 152 is normalized (characteristic) impedance of the analysis apparatus (and the DUT) which is typically 50 ohms.

FIG. 16 is a table showing measurement modes in the analysis apparatus of FIG. 15. This table shows as to which test port of the test set 330 provides the test signal to the DUT 40, and which test ports transmit signals from the DUT to the measurement units, and which test port is connected to the terminal resistor 152. For example, in the mode a, the test port 44 functions as a signal source "S" to input the test signal to the DUT and send the reflected signal from the DUT to the measurement unit 14. The test port 46 functions as a receiver "R" to send the received signal to the measurement units 16, and the test port 48 functions as a load "L" to terminate the corresponding port of the DUT through the terminal resistor 152. Thus, S-parameters S11, S21 and S31 of the DUT 40 are measured in the modes a and b, S-parameters S12, S22 and S32 of the DUT 40 are measured in the modes c and d, and S-parameters S13, S23 and S33 of the DUT 40 are measured in the modes e and f.

Figure 17A:
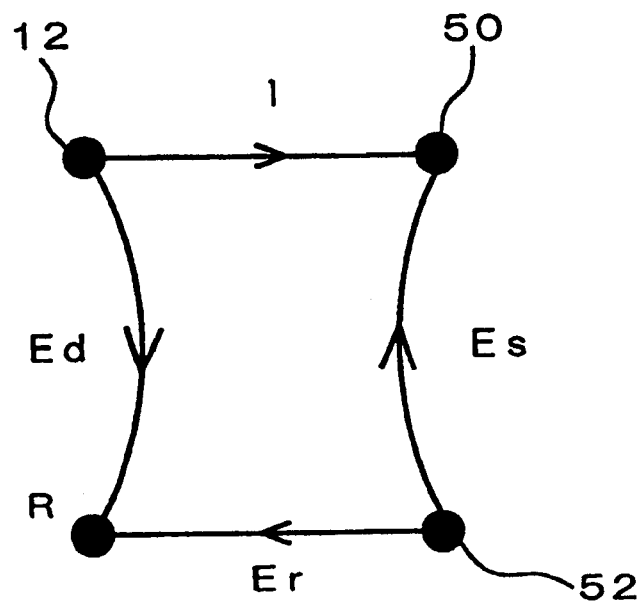
FIG. 17(a) shows a signal flow model for the test port designated by "S" in the table of FIG. 16.
Figure 17B:
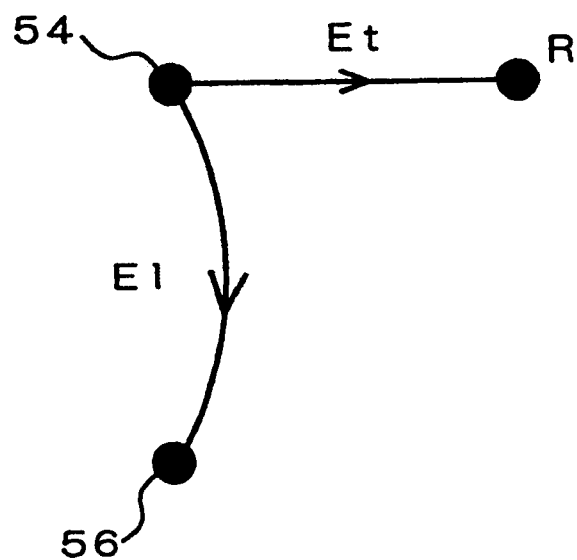
FIG. 17(b) shows a signal flow model for the test port designated by "R" in the table of FIG. 16.

With reference to signal flow graphs of FIGS. 17–19, error terms (coefficients) involved in the measurement modes a–f in the table of FIG. 16 are described below. FIG. 17(a) shows a signal flow model for the test port designated by "S" in the table of FIG. 16, and FIG. 17(b) shows a signal flow model for the test port designated by "R" in the table of FIG. 16. Each of the test ports 44, 46 and 48 is designated by two nodes, nodes 50 and 52 in FIG. 17(a) and nodes 54 and 56 in FIG. 17(b). Since the error terms in FIGS. 17(a) and 17(b) are the same as that of FIGS. 10(a) and (b), no further explanation is given here.

Figure 18:
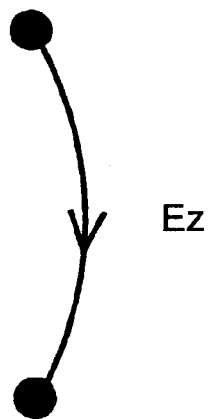
FIG. 18 is a signal flow graph for the test port designated by "L" in the table of FIG. 16.

FIG. 18 is a signal flow graph for the test port designated by "L" in the table 16 where the test port is connected to the terminal resistor 152 in the test set 330. Since the terminal resistor 152 may not be perfect, a part of the signal from the DUT 40 will be reflected back to the test port (error coefficient Ez).

Figure 19:
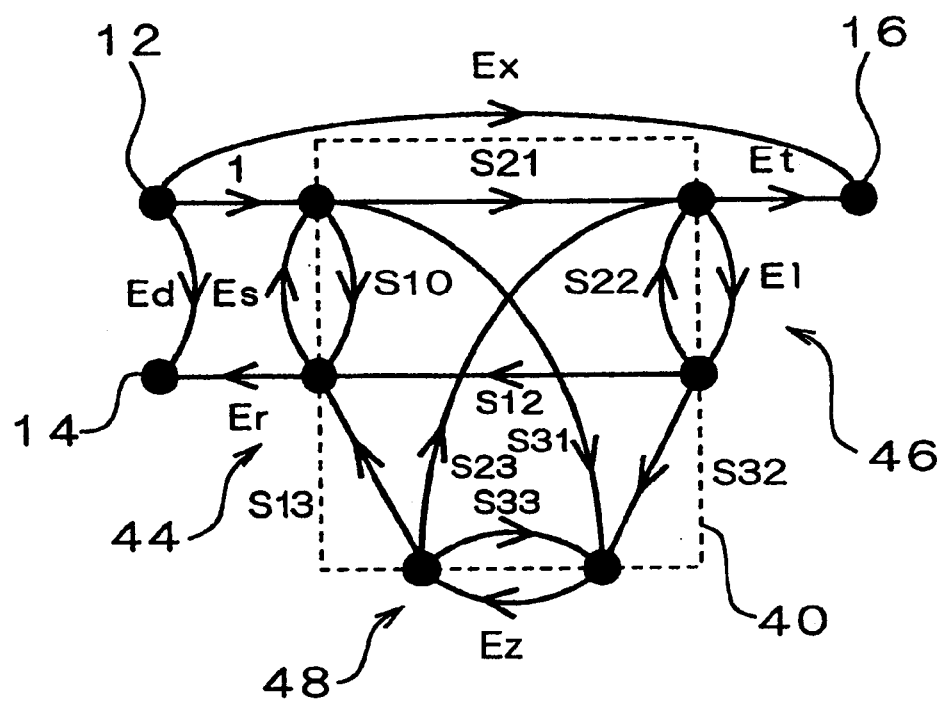
FIG. 19 is a signal flow graph in the measurement mode a of FIG. 16 when the device under test is connected.

FIG. 19 is a signal flow graph when the DUT is connected to the test set 330 in the measurement mode a of FIG. 16. For the three port DUT 40, nine S-parameters S11, S12, S13, S21, S22, S23, S31, S32 and S33 will be defined where each parameter is an amplitude ratio expressed by complex numbers. These S-parameters are known in the art and explained in the foregoing with reference to FIG. 11. In the multi-port analysis apparatus of FIG. 15, all of the S-parameters are obtained by measuring the voltages by the measurement units through the measurement modes a–f.

Figure 21:
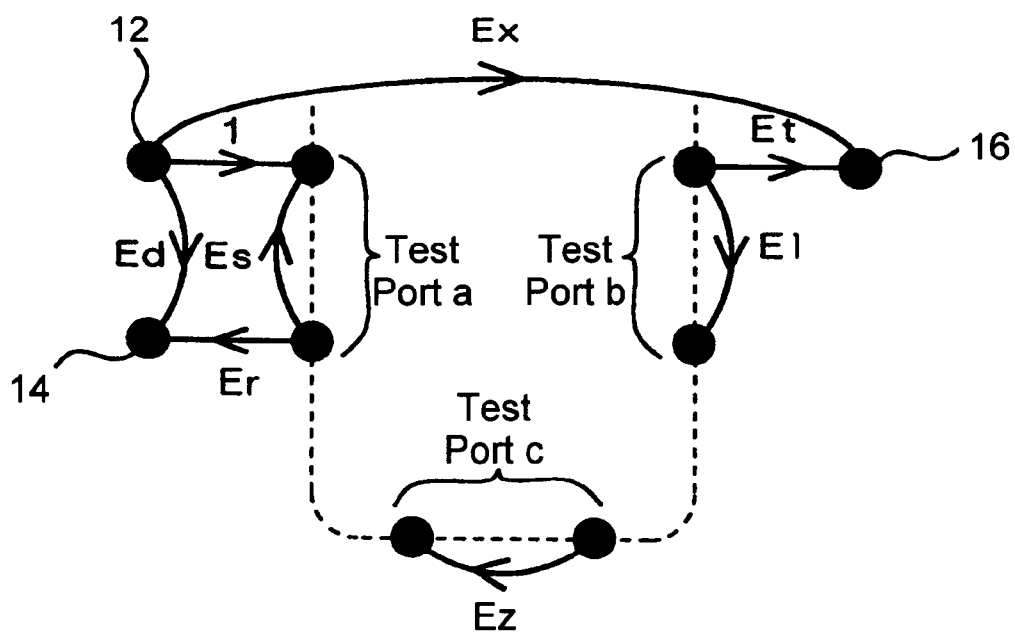
FIG. 21 shows a signal flow graph of the analysis apparatus of FIG. 15 in the calibration process where the device under test is disconnected.

FIG. 20 is a flow diagram showing a calibration process in the multi-port (three port) analysis apparatus of the present invention. During the calibration process, the DUT 40 is disconnected from the test ports of the analysis apparatus. FIG. 21 shows a signal flow graph of the analysis apparatus in the calibration process where the DUT 40 is disconnected. Since the calibration procedure in FIG. 20 is similar to that of FIG. 12, only a brief description is given in the following.

When the calibration process is initiated (step 400), the switch 32 selects one of the measurement mode (step 401). For measuring the error coefficient Ex, the test port a (test port 44) is opened and the test signal is provided to the test port a (step 402). The measurement unit 16 measures the error coefficient Ex (step 403).

For determining the error coefficients Ed, Es and Er, by maintaining the open circuit of the test port a, the measurement unit 14 measures the received signal (step 404). The test port a is short circuited (step 405) and the measurement unit 14 measures the received signal (step 406). The test port a is terminated by a terminal (normalized) resistor (step 407), and the measurement unit 14 measures the received signal (step 408). By solving the equations (1), (2) and (3) obtained in the above procedure, the error coefficients Ed, Es and Er are determined (step 409).

The calibration process of FIG. 20 proceeds to the steps of determining the error coefficients Et and El. The test port a (test port 44) and the test port b (test port 46) are connected together (step 410), and the measurement unit 16 measures the received signal voltage (step 411). By applying the coefficients Ed, Es and Er and the measured voltage to the equations (5) and (6), the error coefficients Et and El are determined (step 412).

By the procedure similar to the steps 410–412, the error coefficients Ez can also be determined. The test port a (test port 44) and the test port c (test port 48) are connected together (step 413), and a voltage VR11 is measured by the measurement unit 14 (step 414). Under this condition, the voltage measured by the measurement units 14 is expressed as follows:

$$VR11 = Ed + ErEz/(1-EsEz) \qquad (9)$$

The process applies the error coefficients Ed, Es and Er obtained in the above to the equation (9), the error coefficient Ez concerning the test port c (test port 48) can be determined (step 415).

Then, the process inquires as to whether there is a remaining measurement mode whose error coefficients are not determined (step 416), and if there is a mode not yet calibrated, the process goes back to the step 401 to repeat the procedures in the steps 401 to 415 until all of the error terms are collected for the measurement modes b–f. Then the calibration process ends.

As described in the foregoing, the error coefficients in the three port device analysis apparatus for all of the measurement modes can be obtained. Thus, when measuring the S-parameters of the DUT by connecting the DUT to the apparatus, such error coefficients are removed (compensated) during the calculation of the S-parameters. Consequently, the S-parameters of the three port DUT can be obtained with high accuracy.

Moreover, in the three port device analysis apparatus of present invention, once the DUT is fully connected, there is no need to change the connection between the analysis apparatus and the DUT. Further, the three port analysis apparatus is provided with the terminal resistor 152 for terminating one of the three ports of the DUT, and the same terminal resistor 152 is included in both the calibration stage and the S-parameter measurement stage. Thus, the accurate measurement can be achieved even when the terminal resistor is deviated from the ideal value.

In the foregoing description of the present invention, various modifications are possible. For example, the error coefficients Ed, Es and Er are determined by using the three conditions, open, short and load. However, different conditions such as terminating the test port by different terminal resistors of known reflection coefficients Sll can also be used. Further, when determining the error coefficients Et and El, it is not necessary that such connections between two test ports be ideal, i.e, the transmission coefficient can be less than one (1). It is only necessary that these different conditions have to be incorporated in the equations (1)–(9) in the calculation of the error coefficients.

Although only preferred embodiments are specifically illustrated and described herein, it will be appreciated that many modifications and variations of the present invention are possible in light of the above teachings and within the purview of the appended claims without departing the spirit and intended scope of the invention.

What is claimed is:

1. A multi-port device analysis apparatus for testing a multi-port device having a plurality of terminals, comprising:
    a signal source for providing a test signal to one of terminals of a multi-port device under test (DUT);
    a plurality of test ports for connecting all of the terminals of the multi-port DUT to the corresponding test ports;
    a plurality of measurement units for measuring signals from the corresponding test ports connected to the corresponding terminals of the multi-port DUT;
    a reference signal measurement unit for measuring the test signal for obtaining reference data relative to measurement of the signals from the test port by the plurality of measurement units;
    a plurality of terminal resistors each being assigned to one of the test ports; and
    switch means for selectively providing the test signal to one of the test ports (input test port) and disconnecting the terminal resistor from the input test port while connecting the terminal resistors to all the other test ports;
    wherein parameters of the multi-port DUT are acquired without changing the connections between the test ports and the terminals of the DUT, while changing selection of the test port by the switch means until all of the test port being assigned as the input test port.

2. A multi-port device analysis apparatus as defined in claim 1, further comprising:
    means for acquiring error coefficients of the multi-port device analysis apparatus without connecting the multi-port DUT prior to measuring the parameters of the multi-port DUT; and
    means for measuring the parameters of the multi-port DUT when connecting all of the ports of the multi-port DUT to the corresponding test ports of the multi-port device analysis apparatus and for calculating the measured values and compensating the error coefficients in the measured parameters to attain true parameters of the multi-port DUT.

3. A multi-port device analysis apparatus as defined in claim 2, wherein said means for acquiring the error coefficients activates the switch means for selectively providing the test signal to the input test port while providing predetermined calibration conditions to the input test port to obtain the error coefficients of the input test port by measuring signals from the input test port with the corresponding measurement unit.

4. A multi-port device analysis apparatus as defined in claim 2, wherein said means for acquiring the error coefficients activates the switch means for selectively providing the test signal to the input test port while providing predetermined calibration conditions to the input test port and/or a particular test port to obtain the error coefficients between the input test port and the particular test port by measuring signals from the of the input test port and the particular test port with the corresponding measurement units.

5. A multi-port device analysis apparatus as defined in claim 2, wherein said means for acquiring the error coefficients activates the switch means for sequentially changing the input test port while measuring the error coefficients until all of the test ports being assigned as the input test port.

6. A multi-port device analysis apparatus as defined in claim 2, wherein said error coefficients includes a first error coefficient which involves a leakage signal from the input test port to a particular test port, a second error coefficient which involves a reflection signal from the input test port, and a third error coefficient which involves a transmission signal between the input test port and the particular test port.

7. A multi-port device analysis apparatus as defined in claim 2, wherein said means for acquiring the error coefficients provides predetermined calibration conditions to the input test port and/or a particular test port wherein said predetermined calibration conditions include "open", "short" and "load" of the test ports.

8. A multi-port device analysis apparatus as defined in claim 1, wherein said parameters of the multi-port DUT include scattering parameters (S-parameters) of the multi-port DUT.

9. A multi-port device analysis apparatus as defined in claim 1, wherein each of said terminal resistors is set to characteristic impedance of the multi-port device analysis apparatus and the multi-port DUT.

10. A method for measuring parameters of a multi-port device with use of a multi-port device analysis apparatus comprising the following steps of:
    (a) acquiring error coefficients of the multi-port device analysis apparatus without connecting the multi-port device under test (DUT) to test ports of the multi-port device analysis apparatus;
    (b) connecting all ports of the multi-port DUT to corresponding test ports of the multi-port device analysis apparatus;
    (c) providing a test signal to one of the ports of the multi-port DUT through a selected test port (input test port) while terminating the other ports of the multi-port DUT through terminal resistors provided in the multi-port device analysis apparatus;

(d) measuring signals from the ports of the multi-port DUT through the corresponding test ports of the multi-port device analysis apparatus by corresponding measurement units;

(e) repeating the steps (c) and (d) for acquiring parameters of the multi-port DUT without changing the connections between the multi-port device analysis apparatus and the multi-port DUT while sequentially changing selection of the test port until all of the test port being assigned as the input test port.

11. A method as defined in claim 10, wherein said step (a) for acquiring the error coefficients of the multi-port device analysis apparatus includes a process of selectively providing the test signal to one of the test ports (test signal port) while providing predetermined calibration conditions to the test signal port to obtain the error coefficients of the test signal port by measuring a signal from the test signal port.

12. A method as defined in claim 10, wherein said step (a) for acquiring the error coefficients of the multi-port device analysis apparatus includes a process of selectively providing the test signal to one of the test ports (test signal port) while providing predetermined calibration conditions to the test signal port and/or a particular test port to obtain the error coefficients of the test signal port and the particular test port by measuring signals from the test signal port and the particular test port.

13. A method as defined in claim 10, wherein said step (a) for acquiring the error coefficients of the multi-port device analysis apparatus includes a process of sequentially changing the selection of test signal port while measuring the error coefficients until all of the test ports being assigned as the test signal port.

14. A three port device analysis apparatus for testing a three port device, comprising:

a signal source for providing a test signal to one of ports of a three port device under test (DUT);

three test ports for connecting all of the three ports of the DUT to the corresponding test ports;

three measurement units for measuring signals from the corresponding test ports connected to the corresponding ports of the DUT;

a reference signal measurement unit for measuring the test signal for obtaining reference data relative to measurement of the signals from the test port by the three measurement units;

three terminal resistors each being assigned to one of the test ports; and switch means for selectively providing the test signal to one of the test ports (input test port) and disconnecting the terminal resistor from the input test port while connecting the terminal resistors to all the other test ports;

wherein parameters of the DUT are acquired without changing the connections between the three port device analysis apparatus and the DUT while changing selection of the test port by-the switch means until all of the test port being assigned as the input test port.

15. A three port device analysis apparatus as defined in claim 14, further comprising:

means for acquiring error coefficients of the three port device analysis apparatus without connecting the DUT prior to measuring the parameters of the DUT; and means for measuring the parameters of the DUT when connecting all of the ports of the DUT to the corresponding test ports of the three port device analysis apparatus and for calculating the measured values and compensating the error coefficients in the parameters to attain true parameters of the DUT.

16. A three port device analysis apparatus as defined in claim 15, wherein said means for acquiring the error coefficients activates the switch means for selectively providing the test signal to the input test port while providing predetermined calibration conditions to the input test port to obtain the error coefficients of the input test port by measuring signals from the input test port with the corresponding measurement unit.

17. A three port device analysis apparatus as defined in claim 15, wherein said means for acquiring the error coefficients activates the switch means for selectively providing the test signal to the input test port while providing predetermined calibration conditions to the input test port and/or a particular test port to obtain the error coefficients between the input test port and the particular test port by measuring signals from the of the input test port and the particular test port with the corresponding measurement units.

18. A three port device analysis apparatus as defined in claim 15, wherein said means for acquiring the error coefficients activates the switch means for sequentially changing the input test port while measuring the error coefficients until all of the test ports being assigned as the input test port.

19. A three port device analysis apparatus as defined in claim 15, wherein said means for acquiring the error coefficients provides predetermined calibration conditions to the input test port and/or a particular test port wherein said predetermined calibration conditions includes "open", "short" and "load" of the test ports.

20. A three port device analysis apparatus for testing a three port device, comprising:

a signal source for providing a test signal to one of ports of a three port device under test (DUT);

three test ports for connecting all of the three ports of the DUT to the corresponding test ports;

two measurement units for measuring signals from corresponding two test ports connected to two corresponding ports of the DUT;

a reference signal measurement unit for measuring the test signal for obtaining reference data relative to measurement of the signals from the test port by the three measurement units;

a terminal resistor;

a first switch means for selectively connecting one of the test ports (first test port) to the terminal resistor; and a second switch means for selectively providing the test signal to one of the test ports (second test port) as an input signal test port;

wherein parameters of the DUT are acquired without changing the connections between the three port device analysis apparatus and the DUT by measuring signals from the second test port and a remaining test port (third test port) while changing selection of the test port by the second switch means until all of the test port being assigned as the input signal test port.

21. A three port device analysis apparatus as defined in claim 20, further comprising:

means for acquiring error coefficients of the three port device analysis apparatus without connecting the DUT prior to measuring the parameters of the DUT; and means for measuring the parameters of the DUT when connecting all of the ports of the DUT to the corresponding test ports of the three port device analysis apparatus and for calculating the measured values and compensating the error coefficients in the parameters to attain true parameters of the DUT.

* * * * *